United States Patent [19]

Pfirsch

[11] Patent Number: 5,736,445
[45] Date of Patent: Apr. 7, 1998

[54] METHOD FOR PRODUCING AT LEAST TWO TRANSSISTORS IN A SEMICONDUCTOR BODY

[75] Inventor: Frank Pfirsch, München, Germany

[73] Assignee: Siemens Aktiengesellschaft, Munich, Germany

[21] Appl. No.: 683,301

[22] Filed: Jul. 18, 1996

[30] Foreign Application Priority Data

Jul. 18, 1995 [DE] Germany ............... 195 26 183.6

[51] Int. Cl.⁶ .................................. H01L 21/8234
[52] U.S. Cl. ................... 438/275; 438/527; 438/530
[58] Field of Search .................... 437/57, 41, 154; 257/376; 438/527, 530

[56] References Cited

U.S. PATENT DOCUMENTS

| | | |
|---|---|---|
| 4,672,738 | 6/1987 | Stengl et al. . |
| 4,757,031 | 7/1988 | Kuhnert et al. . |
| 5,296,393 | 3/1994 | Smayling et al. . |
| 5,300,454 | 4/1994 | Taft et al. . |
| 5,426,325 | 6/1995 | Chang et al. . |

FOREIGN PATENT DOCUMENTS

| | | |
|---|---|---|
| 0 176 778 | 4/1986 | European Pat. Off. . |
| 0 242 623 | 10/1987 | European Pat. Off. . |
| 0 387 999 | 9/1990 | European Pat. Off. . |
| 0 262 356 | 3/1993 | European Pat. Off. . |
| 0 637 846 A2 | 2/1995 | European Pat. Off. . |

OTHER PUBLICATIONS

"Variation of Lateral Doping—A New Concept to Avoid High Voltage Breakdown of Planar Junctions" (Stengl et al.), Siemens Research Laboratories.

IEEE Journal of Solid-State Circuits, vol. SC-21, No. 2, Apr. 1986, pp. 293–296, "An Enhanced Fully Scaled 1.2-$\mu$m CMOS Process for Analog Applications" by Robert K. Reich et al.

Primary Examiner—John Niebling
Assistant Examiner—Brendan Mee
Attorney, Agent, or Firm—Herbert L. Lerner; Laurence A. Greenberg

[57] ABSTRACT

A method for producing at least two transistors in one semiconductor body includes placing a first well doping region for receiving a first transistor and a second well doping region serving as a charge carrier sink region for a second transistor into a semiconductor body by masked doping with ensuing heat treatment. A mask for forming the second well doping region includes regions being permeable to a dopant and regions being impermeable to the dopant.

8 Claims, 1 Drawing Sheet

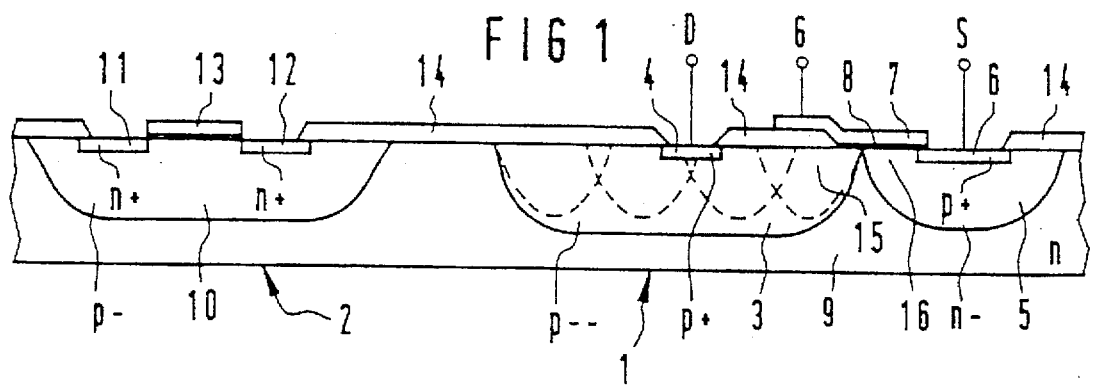
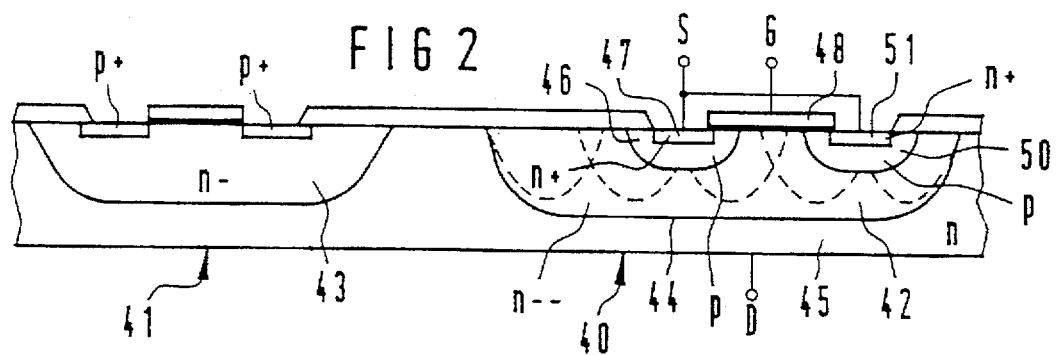
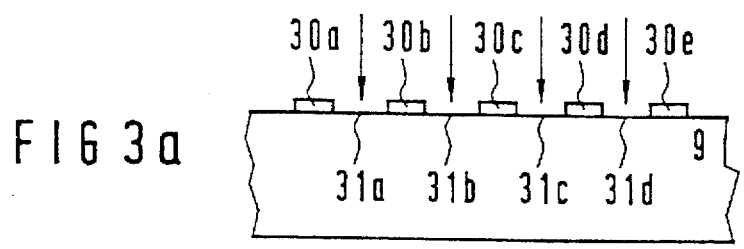
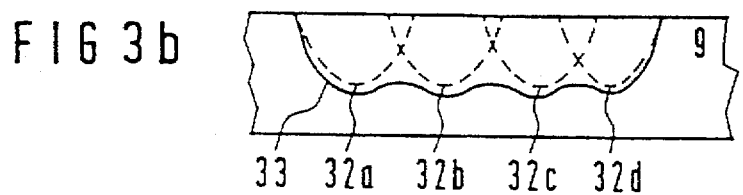

METHOD FOR PRODUCING AT LEAST TWO TRANSSISTORS IN A SEMICONDUCTOR BODY

BACKGROUND OF THE INVENTION

Field of the Invention

The invention relates to a method for producing at least two transistors in a semiconductor body by using well doping regions.

The electric strength of transistors is known to depend on the length of a space charge zone in a charge carrier sink region of the transistor, which is the drain region in the case of MOS transistors and is the collector region in the case of bipolar transistors. Regions of adequately low dopant concentration are necessary in order to obtain a suitably long length of the space charge zone. The resultant transistors then have a high breakdown voltage.

There is a need at present to construct such components with high electric strength and other components with low electric strength on the same single integrated semiconductor chip. The first of those transistors are used to switch high voltages and/or high currents. The second of those transistors are used to accomplish digital logic functions or analog functions. Since many transistors are typically necessary to achieve those functions in terms of circuitry, the packing density should be as high as possible and the area occupied by a transistor should be as small as possible.

In such integrated circuit chips, well doping regions have been used heretofore for the transistors having the high electric strength. If those wells have low doping in order to attain a suitably high electric strength, and if moreover the step used to produce the wells is employed simultaneously to produce complementary CMOS transistors having the low electric strength, then the packing density for the CMOS transistors with the low electric strength is relatively low, because of the resultant great channel lengths. On the other hand, if different production steps are used to create the respective well regions for transistors of high and low electric strength, then while the disadvantage in terms of surface area can be reduced, nevertheless additional photolithographic steps and implantation steps are required. Producing such circuits is consequently complicated and accordingly expensive.

Published European Patent Applications 0 387 999 A2 and 0 242 623 A2 describe methods for producing MOS transistors that are suitable for digital signal processing and MOS transistors that are suitable for processing high-voltage signals in a single integrated circuit. Well doping regions that receive the first of those transistors and well doping regions that act as electrode terminals for the latter of those transistors are created. In another source in the literature, namely IEEE Journal of Solid-State Circuits, Vol. SC-21, No. 2, April 1986, pp. 293–296, "An Enhanced Fully Scaled 1.2-µm CMOS Process for Analog Applications" by Robert K. Reich et al, a similar production method for a high-voltage bipolar transistor is described.

SUMMARY OF THE INVENTION

It is accordingly an object of the invention to provide a method for producing at least two transistors in a semiconductor body, which overcomes the hereinafore-mentioned disadvantages of the heretofore-known methods of this general type, which produces at least two transistors of different electric strength on a single semiconductor chip and which can be carried out with as few process steps as possible.

With the foregoing and other objects in view there is provided, in accordance with the invention, a method for producing at least two transistors in one semiconductor body, which comprises placing a first well doping region for receiving a first transistor and a second well doping region serving as a charge carrier sink region for a second transistor into a semiconductor body by masked doping with ensuing heat treatment; and including regions being permeable to a dopant and regions being impermeable to the dopant in a mask for forming the second well doping region.

In accordance with another mode of the invention, there is provided a method which comprises extending the dopant-impermeable regions in the doping mask at most to cause a diffusion, because of the heat treatment, into the portions of the semiconductor body being covered on the surface by the impermeable regions, resulting in a substantially uniform course of dopant concentration in the second well doping region.

In accordance with a further mode of the invention, there is provided a method which comprises surrounding the permeable regions with the impermeable regions, and spacing each of the permeable regions apart from one another by a constant spacing.

In accordance with an added mode of the invention, there is provided a method which comprises forming the impermeable regions and the permeable regions in strips, and spacing the permeable regions apart from one another by the same distance.

In accordance with an additional mode of the invention, there is provided a method which comprises forming the first transistor as an n-channel MOS transistor and forming the second transistor as a p-channel MOS transistor; forming the semiconductor body to be n-conductive, and forming the first and second well doping regions in the semiconductor body to be p-conductive; placing an n-conducting further well doping region in the semiconductor body next to the second well doping region as a channel region, and placing a p-conductive region in the further well doping region; and contacting the p-conducting region as a source of the second MOS transistor, and contacting the second well doping region as a drain of the second MOS transistor.

In accordance with a concomitant mode of the invention, there is provided a method which comprises forming the first transistor as a p-channel MOS transistor, and forming the second transistor as an n-channel MOS transistor; forming the semiconductor body to be n-conductive, and forming the first and second well doping regions in the semiconductor body to be n-conductive; placing at least one p-conductive region in the second well doping region as a channel region, and placing an n-conductive region in the at least one p-conductive region; and contacting the n-conductive region as a source of the second MOS transistor, and contacting the second well doping region as a drain of the second MOS transistor.

Masking the doping mask inside the second well doping region provided for the high-electric strength transistor causes a lower quantity of charge carriers to appear in the semiconductor body than in the first well doping region, which acts to receive the complementary transistor having the low electric strength. After the diffusion effected by the heat treatment, a lower dopant concentration than in the first well is established overall in the second well. The second well is then used as the drain region of the MOS transistor having the high electric strength. Due to the low dopant concentration in the second well, this MOS transistor has a high electric strength. No additional mask steps are inserted during the production. The parameters for the doping process (treatment time, charge carrier dose, etc.) can be selected in such a way that the smallest possible well sizes are obtained for the first wells for the MOS transistors having the low electric strength, and the packing density is thus high. The level of the electric strength, which is dependent on the charge carrier concentration in the second wells, can be adjusted by varying the ratio of permeable to impermeable regions of the doping mask. The overall result is that an integrated circuit can be produced that has high-electric strength transistors and also has transistors for low electric strength, with a high packing density. The method requires no additional masking steps.

The structure for the dopant-permeable and dopant-impermeable regions of the doping mask is adjusted to suit the desired doping profile and the desired charge carrier concentration. Preferably, both regions are constructed in striplike form with a constant strip spacing and constant strip width both along one strip and with regard to all of the strips relative to one another. A charge carrier gradient can be created through the use of varying spacings. Decreasing spacings toward the drain assure that the danger of an avalanche breakdown in the drift path of the drain region can be reduced. In principle, any regular pattern can be used. For example, the permeable regions may be constructed in rectangular form, each being spaced apart by a constant distance from one another. The minimum size of the impermeable and permeable regions is on the order of magnitude of the minimum structural size that can be produced by the production process. This size is typically dictated by the minimum feasible gate length of an MOS transistor. The maximum size of a dopant-impermeable region of the doping mask should be chosen in such a way that below the semiconductor body covered on the surface by this region, the most uniform possible course of the dopant concentration still results. Preferably, the width and spacing of the strips are each on the order of magnitude of the minimum structure that can be made. This produces a ratio of the surface areas of the impermeable region and the permeable region of the doping mask of 1:1. When rectangular permeable regions with an edge length L are used that are spaced apart from one another by a spacing L, the resultant area ratio is 3:1. The area ratio is adjusted depending on the desired dopant concentration to be created in the second well for the transistor having the low electric strength.

In preferred embodiments, a PMOS transistor for high-voltage applications and an n-channel MOS transistor for digital and analog signal processing functions can be produced on one chip, or else a DMOS power transistor together with a p-channel MOS transistor for the signal processing functions can be produced on the same chip.

In Published European Patent Application 0 176 778 A2, corresponding to U.S. Pat. No. 4,672,738, a method for producing a pn junction is described, in which an excessively tight curvature at the edge of a dopant profile that would lead to an excessive field strength load is to be avoided by establishing a gradual rise and fall in the doping at the edge, so that the overall breakdown voltage is increased. That is accomplished by providing that the doping mask has openings which are smaller in size and/or farther apart from one another as the distance from the edge increases.

In European Patent 0 262 356 B1, corresponding to U.S. Pat. No. 4,757,031, a method for producing a pn junction is described in which a layer applied to the surface of the semiconductor body is used that is incorporated into the dopant. The layer is structured in such a way that some portions of the layer are removed entirely or in part. A varying dopant concentration in the semiconductor body located beneath is assured through the use of ensuing tempering. A gradual rise in the boundary surface of the incorporated dopant on the edge of the doping region, or a gradual transition between two doping regions, is assured through the use of different spacings of the non-removed structural elements.

Other features which are considered as characteristic for the invention are set forth in the appended claims.

Although the invention is illustrated and described herein as embodied in a method for producing at least two transistors in a semiconductor body, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a fragmentary, diagrammatic, cross-sectional view of a first exemplary embodiment of the invention with a PMOS high-voltage transistor and an n-channel MOS field effect transistor for signal processing;

FIG. 2 is a view similar to FIG. 1 of a second exemplary embodiment of the invention, with a DMOS power transistor and a p-channel MOS transistor for the signal processing; and FIGS. 3a and 3b are fragmentary, cross-sectional views of a doping mask and a resultant dopant profile.

DESCRIPTION OF THE PREFERRED EMBODIMENTS

Referring now to the figures of the drawings in detail and first, particularly, to FIG. 1 thereof, there is seen a cross section through a semiconductor body 9 in which a PMOS high-voltage transistor 1 and an n-channel MOS field effect transistor 2 that performs digital switching functions or an analog signal processing function, are formed. The second transistor 1 includes a p-conducting drain doping region 3, which is constructed in the form of a well. A well is a doping region of relatively low doping ($10^{16} \ldots 10^{17}$ cm$^{-3}$), which extends relatively deeply from the surface of the semiconductor body 9 into the semiconductor body. The concentration and type of doping is represented symbolically as p$^-$. A high-doped p-conducting (p$^+$) terminal doping region for a drain terminal 4 is provided inside the well 3. Typically it has a dopant concentration that is higher by at least two orders of magnitude (powers of 10). An n$^-$-conducting well 5, in which an inversely conducting channel of the MOS transistor can develop, is next to the well 3. A p$^+$-conducting source region 6 is located inside the channel well 5. A gate electrode 7 of polysilicon is applied over a gate oxide 8 above the channel well 5. The MOS first transistor 2 is known to include one p$^-$-well 10, n$^+$-conducting drain and source regions 11 and 12, and a gate 13. The semiconductor body 9 is substantially covered by a thick field oxide 14.

One prerequisite for producing the transistors is that the semiconductor body 9, which is a weakly n-doped silicon semiconductor material, be prepared in such a way that well doping regions can be made therein. The dopant concentration of the substrate is lower than the dopant concentration of one of the well doping regions.

In order to produce the first and second doping regions 10, 3, a doping mask is applied to the surface of the semiconductor body 9. In the region of the well 10, this mask is completely permeable to the dopants and in the region of the well 3 it has the cross section shown in FIG. 3a. The mask includes regions 30a ... 30e that are impermeable to the dopant, and permeable regions 31a ... 31d disposed between these impermeable regions. The impermeable regions 30a–30e are formed of a suitable lacquer, and the permeable regions 31a–31d are formed of openings in the lacquer. This structuring is applied by a photolithographic process. The dopant is introduced into the semiconductor body 9 at the openings through conventional techniques, preferably ion implantation. In other words, the doping of the regions 3, 10 is established through the use of a common doping process with a single mask. Next, the doping for the n⁻-well region 5 is produced.

At the end of the implantation process, dopant atoms are located in the region of the well 3 to be produced, below the openings 31a ... 31d, while the portions in the semiconductor body below the impermeable mask regions 30a ... 30e contain essentially no dopant atoms, except for scattering effects. Next, the semiconductor body provided with the implantations 10, 3, 5 is subjected to a heat treatment, causing out-diffusion of the introduced dopants. The diffusion process takes place with the usual parameters in terms of temperature and duration. The dopant atoms located below the openings 31a–31d of the doping mask diffuse laterally beneath the respectively adjoining mask regions 30a–30e. The result is various diffused dopant distributions 32a ... 32d shown in FIG. 3b, which overall produce a course 33 of a boundary surface relative to the material of the semiconductor body 9. Since only the portion of the surface of the semiconductor body 9 at the well 3 to be produced surrounding the openings 31a–31d was exposed to the implantation ions during the implantation, while conversely the entirely surface was exposed in the region of the well 10 to be produced, the dopant concentration established after the heat treatment is less in the well 3 (p⁻⁻) than in the well 10 (p⁻). For both wells 3, 10, the same ion implantation step is carried out with only one mask, and the same heat treatment step is carried out. Additional masks and diffusion steps are unnecessary. The dopant dose is adjusted in such a way that it is equivalent to the usual dopant dose for the transistor 10, so that the portion of the surface of the semiconductor chip containing the transistors having the low electric strength can be packed as tightly as possible. The transistor 2 then is the complementary n-channel transistor, next to a p-channel transistor that is not located in the same well, of the CMOS circuit that provides the small-signal processing.

The decisive factor for the electric strength of the transistor 1 is a region 15 of the well 3 that extends from the end of the drain terminal doping 4 to the end of a channel 16 in the well 5. Due to the low p⁻⁻-doping of the well 3, a sufficiently large space charge zone can develop there, which is suitable for receiving high drain-to-source voltages that occur, for instance, in the depletion situation of the transistor.

The regions or portions 30a–30e, 31a–31d of the doping mask may be constructed in striplike fashion. At lengths of 1 ... 2 μm, for a 1-μm technology, an electric strength of approximately 80V can be attained for a high-voltage PMOS transistor. With an unstructured p-well, only 35V can be attained. A further elevation in the breakdown voltage can be attained if the region or path 15 is widened. Then additional strips 30a–30e, 31a–31d are added adjacent the region 30e. The height of the p⁻⁻-dopant concentration of the well 3 is adjusted by varying the area ratio of the mask region 30a–30e to the mask region 31a–31d. Any pattern is suitable for structuring the doping mask above the well region 3 to be produced. Rectangles and squares that are spaced apart by a constant distance from one another can preferably be used for the permeable regions of the mask. Through the use of the constant spacing relations, the result after heat diffusion in the well 3 is a uniform, virtually constant course of the dopant concentration. If the spacings of the permeable regions of the doping mask change, then a dopant concentration gradient is attained. For instance, the spacings of the permeable regions inside the region or space charge zone 15 may decrease toward the drain terminal region 4, resulting in an elevation of the dopant concentration toward the drain terminal region 4. In this way, avalanche breakdown effects are avoided.

The configuration shown in FIG. 2 includes a DMOS transistor 40 and a p-channel MOS transistor 41 for signal processing. The doping for a somewhat higher-doped n⁻⁻-conducting well 42 of the DMOS second transistor 40 and an even higher-doped n⁻-conducting well 43 of the p-channel MOS first transistor 41 are incorporated in one step into a weakly n-conducting semiconductor substrate 45. The doping mask is structured as shown in FIG. 3a in the region above the well 42 to be created. A course 44 of this well is created in turn through heat diffusion. The n⁻⁻-well 42 of the transistor 40 acts as a drain electrode. A drain contact terminal D is provided in the n-substrate 45, for instance through the use of a highly doped n-conducting terminal doping region, either on the side opposite a lower boundary surface of the well 42 (as shown in FIG. 2) or through the use of a terminal doping region from the surface of the non-illustrated semiconductor body. Once again it is advantageous that a single doping mask is used to make the doping regions 43 and 42, so that both regions are produced by the same doping operation.

At least one p-conducting region 46 is incorporated into the well 42, and the channel of the DMOS transistor can form in this region. An n⁺-conducting region 47 acting as a source electrode is then introduced inside the region 46. A control gate 48 is located above the channel region 46 between the source doping 47 and the drain well 42. Many additional channel and source regions 50 and 51, respectively, may be incorporated into the well 42, with the gate electrode 48 being lengthened accordingly.

In the case of the DMOS transistor 40, the course of field intensity within the space charge zone constructed in the well 42 extends in the direction of the semiconductor substrate 45 and thus toward the drain terminal contact on the back side. An elevation of the electric strength can be achieved in this case by varying the area ratio of impermeable regions to openings within the mask, in order to reduce the dopant concentration inside the well 42 and moreover, along with this, by deepening the well 42 and deepening the semiconductor body portion 45 that is operative as a drain region.

In FIGS. 1 and 2, the doping regions 3 and 42 act as drain electrodes of the respective MOS transistors 1 and 40. In general, however, the invention can be applied to any charge carrier sink region of a transistor, for instance being applied to the production of collector doping regions with reduced charge carrier concentration in a bipolar pnp or npn transistor, in order to attain an elevated electric strength.

I claim:

1. A method for producing at least two transistors in one semiconductor body, which comprises:

defining in a doping mask a first well doping region and a second well doping region, the second well doping region including dopant-permeable regions and dopant-impermeable regions;

placing, with the doping mask, a p-conductive first well doping region for receiving an n-channel MOS transistor in an n-conductive semiconductor substrate and a p-conductive second well doping region serving as a charge carrier sink region for a p-channel MOS transistor, and subsequently heat treating the semiconductor body;

placing an n-conductive further well doping region in the semiconductor body next to the second well doping region as a channel region, and placing a p-conductive region in the further well doping region; and contacting the p-conductive region as a source of the p-channel MOS transistor, and contacting the second well doping region as a drain of the p-channel MOS transistor.

2. The method according to claim 1, which comprises defining an extent of the dopant-impermeable regions in the doping mask such that diffusion occurs during the heat treating step, into the portions of the semiconductor body which are covered on the surface by the dopant-impermeable regions, resulting in a substantially uniform dopant concentration in the second well doping region.

3. The method according to claim 1, which comprises surrounding the permeable regions with the impermeable regions, and spacing each of the permeable regions apart from one another by a constant spacing.

4. The method according to claim 1, which comprises forming the impermeable regions and the permeable regions in strips, and spacing the permeable regions apart from one another by the same distance.

5. A method for producing at least two transistors in one semiconductor body, which comprises:

defining in a doping mask a first well doping region and a second well doping region, the second well doping region including dopant-permeable regions and dopant-impermeable regions;

placing, with the doping mask, an n-conductive first well doping region for receiving an p-channel MOS transistor in an n-conductive semiconductor substrate and an n-conductive second well doping region serving as a charge carrier sink region for an n-channel MOS transistor, and subsequently heat treating the semiconductor body;

placing a p-conductive region in the second well doping region as a channel region, and placing an n-conductive region in the p-conductive region; and contacting the n-conductive region as a source of the n-channel MOS transistor, and contacting the second well doping region as a drain of the n-channel MOS transistor.

6. The method according to claim 5, which comprises defining an extent of the dopant-impermeable regions in the doping mask such that diffusion occurs during the heat treating step, into the portions of the semiconductor body which are covered on the surface by the dopant-impermeable regions, resulting in a substantially uniform dopant concentration in the second well doping region.

7. The method according to claim 5, which comprises surrounding the permeable regions with the impermeable regions, and spacing each of the permeable regions apart from one another by a constant spacing.

8. The method according to claim 5, which comprises forming the impermeable regions and the permeable regions in strips, and spacing the permeable regions apart from one another by the same distance.

* * * * *